(12) United States Patent
Razon, III et al.

(10) Patent No.: US 10,546,805 B2
(45) Date of Patent: Jan. 28, 2020

(54) INTEGRATED CIRCUIT PACKAGE WITH CONDUCTIVE CLIPS

(71) Applicant: TEXAS INSTRUMENTS INCORPORATED, Dallas, TX (US)

(72) Inventors: Oscar Paulo Razon, III, Angeles (PH); Julie Pacio Acuña, Atok (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/897,260

(22) Filed: Feb. 15, 2018

(65) Prior Publication Data

US 2019/0206773 A1 Jul. 4, 2019

Related U.S. Application Data

(60) Provisional application No. 62/611,834, filed on Dec. 29, 2017.

(51) Int. Cl.
*H01L 23/495* (2006.01)
*H01L 23/00* (2006.01)

(52) U.S. Cl.
CPC .. *H01L 23/49575* (2013.01); *H01L 23/49524* (2013.01); *H01L 24/32* (2013.01); *H01L 24/33* (2013.01); *H01L 24/40* (2013.01); *H01L 24/41* (2013.01); *H01L 24/73* (2013.01); *H01L 24/83* (2013.01); *H01L 24/84* (2013.01); *H01L 24/92* (2013.01); *H01L 2224/32245* (2013.01); *H01L 2224/33181* (2013.01); *H01L 2224/4007* (2013.01); *H01L 2224/40105* (2013.01); *H01L 2224/40245* (2013.01); *H01L 2224/4118* (2013.01); *H01L 2224/41051* (2013.01); *H01L 2224/73213* (2013.01); *H01L 2224/83815* (2013.01); *H01L 2224/84138* (2013.01); *H01L 2224/9211* (2013.01)

(58) Field of Classification Search
CPC ......... H01L 23/49575; H01L 23/49524; H01L 24/32; H01L 24/40; H01L 24/33; H01L 24/41; H01L 24/73; H01L 24/83; H01L 24/84; H01L 24/92; H01L 2224/32245; H01L 2224/33181; H01L 2224/4007; H01L 2224/40105; H01L 2224/40245; H01L 2224/41051; H01L 2224/4118; H01L 2224/73213; H01L 2224/83815; H01L 2224/84138; H01L 2224/9211
USPC .......................................................... 257/666
See application file for complete search history.

(56) References Cited

U.S. PATENT DOCUMENTS

| | | | |
|---|---|---|---|
| 7,095,113 B2 | 8/2006 | Xiaochun et al. | |
| 2005/0199985 A1* | 9/2005 | Xiaochun | H01L 23/49541 257/666 |
| 2008/0246130 A1* | 10/2008 | Carney | H01L 23/4334 257/675 |

* cited by examiner

*Primary Examiner* — Tong-Ho Kim
(74) *Attorney, Agent, or Firm* — Dawn Jos; Charles A. Brill; Frank D. Cimino

(57) ABSTRACT

An electronic device includes a lead frame, a first clip, a second clip, and a plurality of semiconductor devices. The first clip is stacked with the lead frame. The second clip stacked with the first clip and the lead frame. The second clip includes a first protrusion that engages the first clip and secures the second clip to the first clip. The semiconductor devices are conductively coupled to the lead frame via the first clip and the second clip.

19 Claims, 5 Drawing Sheets

INTEGRATED CIRCUIT PACKAGE WITH CONDUCTIVE CLIPS

CROSS-REFERENCE TO RELATED APPLICATIONS

The present application claims priority to U.S. Provisional Patent Application No. 62/611,834, filed Dec. 29, 2017, entitled "Integrated Circuit Package with Conductive Cops," which is hereby incorporated herein by reference in its entirety for all purposes.

BACKGROUND

Integrated circuit ("IC") packages typically include at least one die and at least one substrate to which the die is attached by an attachment medium such as solder or epoxy. The substrate facilitates electrical attachment of the die to other electronics, which may be within or outside the IC package. The various components of the IC package are generally encased in a protective mold compound, such as epoxy. A quad flat no lead (QFN) package is one type of IC package used to package vertically stacked dies. In a QFN package, dies, lead frames and electrical connection clips are arranged in a vertical stack and are interconnected by an attachment medium such as solder or epoxy. The stack is subsequently covered with heated mold compound, which cures to form a hard encasement around the stack. One face of a QFN package typically has a central exposed die attachment pad and a row of exposed lead pads on opposite sides of the die attachment pad. The lead pads allow the QFN to be connected with external circuitry.

SUMMARY

A method and apparatus for maintaining alignment of conductive clips in packaged semiconductor device that includes stacked die are disclosed herein. In one example, an electronic device includes a lead frame, a first clip, a second clip, and a plurality of semiconductor devices. The first clip is stacked with the lead frame. The second clip stacked with the first clip and the lead frame. The second clip includes a first protrusion that engages the first clip and secures the second clip to the first clip. The semiconductor devices are conductively coupled to the lead frame via the first clip and the second clip.

In another example, a circuit package includes a first clip and a second clip. The first clip includes a first channel formed in a first edge of the first clip. The second clip is stacked with the first clip. The second clip includes a first protrusion formed at a first edge of the second clip. The first protrusion engages the first channel of the first clip to secure the second clip to the first clip.

In a further example, a method for packaging an electronic device includes disposing a first clip on a lead frame and disposing a second clip in a stack with the first clip and the lead frame. Disposing the second clip includes engaging a first protrusion of the second clip with a first channel of the first clip.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors. As used herein, the terms "about" and "approximately" define a range of +/−10% from a reference value. Accordingly, about or approximately 10 millimeters encompasses a range of 9 to 11 millimeters.

Quad flat no lead (QFN) and other types of integrated circuit (IC) packages use conductive clips (e.g., copper clips) to connect stacked semiconductor die to the package lead frame, and to the package I/O leads provided by the lead frame. The conductive clips provide lower connection resistance, lower connection inductance, and better thermal performance than wirebond connections. However, use of conductive clips is subject to various issues. For example, during the packaging processes, after conductive clip is positioned, solder that connects the conductive clip to a semiconductor die and to the lead frame is reflowed. Surface tension of the solder during reflow can cause the clip to move. The movement of the clip can cause misalignment between the clip and lead frame that results in a poor connection or lack of connection between the clip and the lead frame, which in turn lead to reduced yields and higher costs.

In packages that include multiple stacked clips to conductively couple multiple stacked die to a lead frame, the clips include engagement features that secure the clips to one another, thereby ensuring that solder reflow does not change the position of one clip relative to another. A first clip of a stacked set of clips includes a channel formed at an edge of the clip. A second clip of the stacked set of clips includes a finger, projection, or protrusion that engages the channel of the first clip when the second clip is positioned in the stack. Engagement of the channel and protrusion of two clips secures the clips to one another and prevents relative movement caused by solder reflow. Embodiments of the clips disclosed herein may include channels and/or corresponding protrusions along multiple edges.

Figure 1:
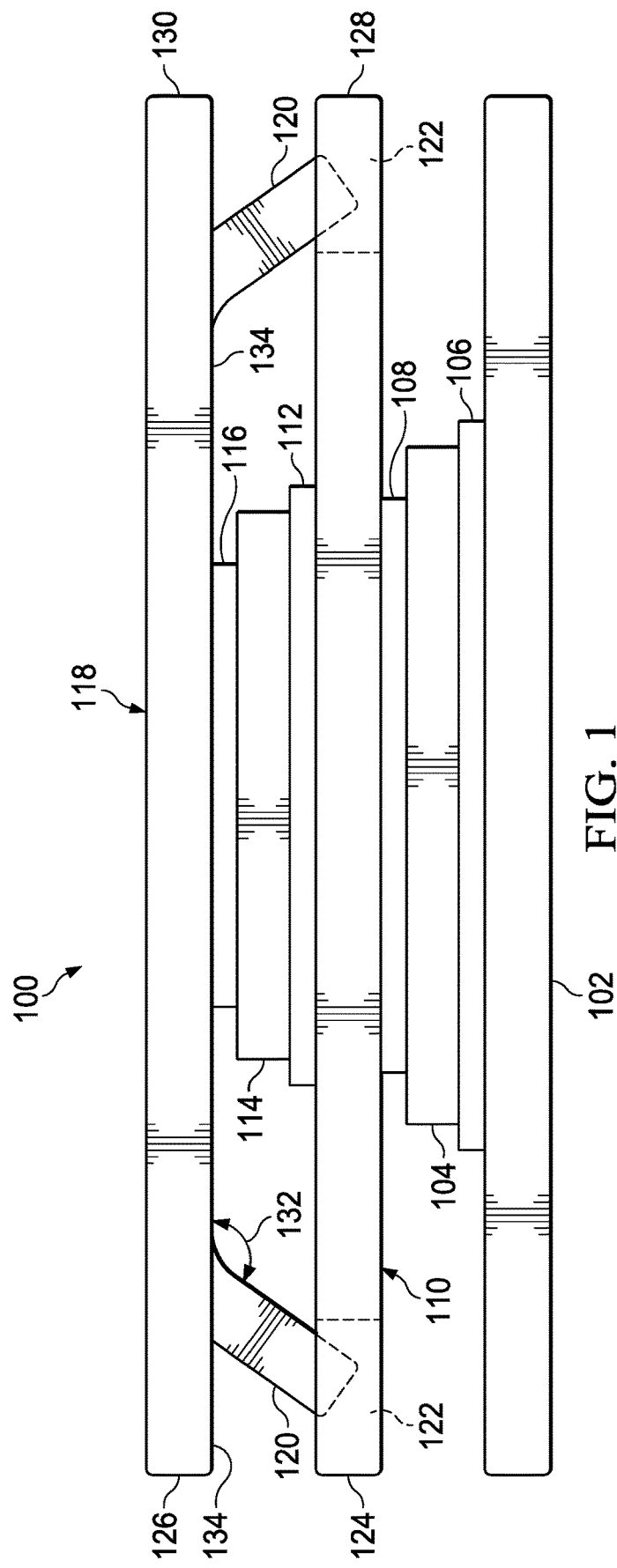
FIG. 1 shows a side view of an integrated circuit stack that includes interlocking clips in accordance with various examples.

FIG. 1 shows a side view of an electronic device 100 that includes interlocking clips in accordance with various examples. An electronic device 100 includes a lead frame 102, a first semiconductor device 104, a first clip 110, a second semiconductor device 114, and a second clip 118 arranged as a stack. The first semiconductor device 104 may be metal oxide semiconductor field effect transistor (MOSFET), a bipolar transistor, an integrated circuit, or another semiconductor device. The second semiconductor device 114 may be a MOSFET, a bipolar transistor, an integrated circuit, or another semiconductor device. The first clip 110 is a conductive structure that may be formed of copper or other conductive material. The first clip 110 includes fingers that extend to the lead frame 102 to conductively couple the first clip 110 to the lead frame 102. The second clip 118 is a conductive structure that may be formed of copper or other conductive material. The second clip 118 includes fingers that extend to the lead frame 102 to conductively couple the second clip 118 to the lead frame 102. The first semiconductor device 104 is secured to the lead frame 102 by solder 106 or a conductive adhesive. The first clip 110 is secured to the first semiconductor device 104 by solder 108 or other conductive adhesive. The second semiconductor device 114 is secured to the first clip 110 by solder 112 or a conductive adhesive. The second clip 118 is secured to the second semiconductor device 114 by solder 116 or a conductive adhesive.

The first clip 110 and the second clip 118 include complementary alignment features to ensure that second clip 118 remains properly positioned with regard to the first clip 110 and the lead frame 102 when the solder 116 is reflowed during manufacture of the electronic device 100. The first clip 110 includes a channel 122 formed at first edge 124 of the first clip 110. The channel 122 may also be referred to as a slot or aperture. The second clip 118 includes a protrusion 120 formed at a first edge 126 of the second clip 118. The protrusion 120 may also be referred to as a projection, tab, or finger. The protrusion 120 engages the channel 122 to prevent the second clip 118 from moving relative to the first clip 110 when the solder 116 is reflowed. The first clip 110 may also include a channel 122 formed at a second edge 128 of the first clip 110, and the second clip 118 may include a protrusion 120 formed at a second edge 130 of the second clip 118. The protrusion 120 formed at a second edge 130 of the second clip 118 engages the channel 122 formed at a second edge 128 of the first clip 110 to prevent the second clip 118 from moving relative to the first clip 110 when the solder 116 is reflowed. In some embodiments, the second edge 128 of the first clip 110 is opposite the first edge 124 of the first clip 110, and the second edge 130 of the second clip 118 is opposite the first edge 126 of the second clip 118 as shown in FIG. 1. In some embodiments two or more edges of the first clip 110 and second clip 118 may include one or more channel 122 or protrusion 120 respectively positioned for engagement.

In some embodiments of the second clip 118, the protrusion 120 extends from the surface 134 at an oblique angle 132. In some embodiments of the second clip 118, the protrusion 120 extends from the surface 134 at a substantially right angle.

While the embodiment illustrated in FIG. 1 shows the channel 122 formed in an edge of the first clip 110 and the protrusion 120 formed at an edge of the second clip 118, in some embodiments, the channel 122 may be formed in an edge of the second clip 118 and the protrusion 120 may be formed at an edge of the first clip 110. In such embodiments the protrusion 120 of the first clip 110 extends to and engages the channel 122 of the second clip 118 to prevent the second clip 118 from moving when the solder 116 is reflowed.

Figure 2:
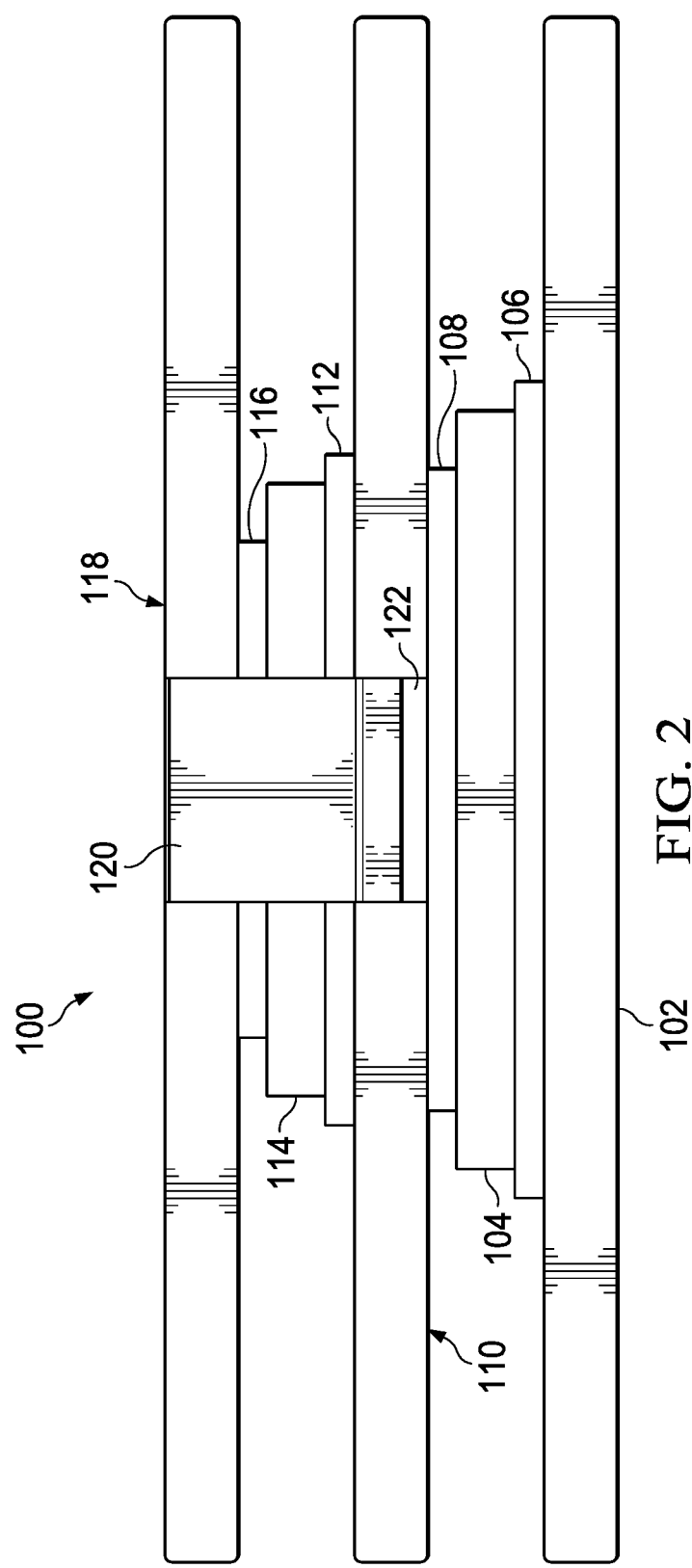
FIG. 2 shows a front view of an integrated circuit stack that includes interlocking clips in accordance with various examples.

FIG. 2 shows a front view of the electronic device 100 that includes interlocking clips in accordance with various examples. In FIG. 2, the protrusion 120 of the second clip 118 is shown extending to and engaging the channel 122 of the first clip 110 to prevent the second clip 118 from moving laterally (in the plane of the surface 134 of the second clip 118) with respect to the first clip 110 and the lead frame 102 when the solder 116 is reflowed.

Figure 3:
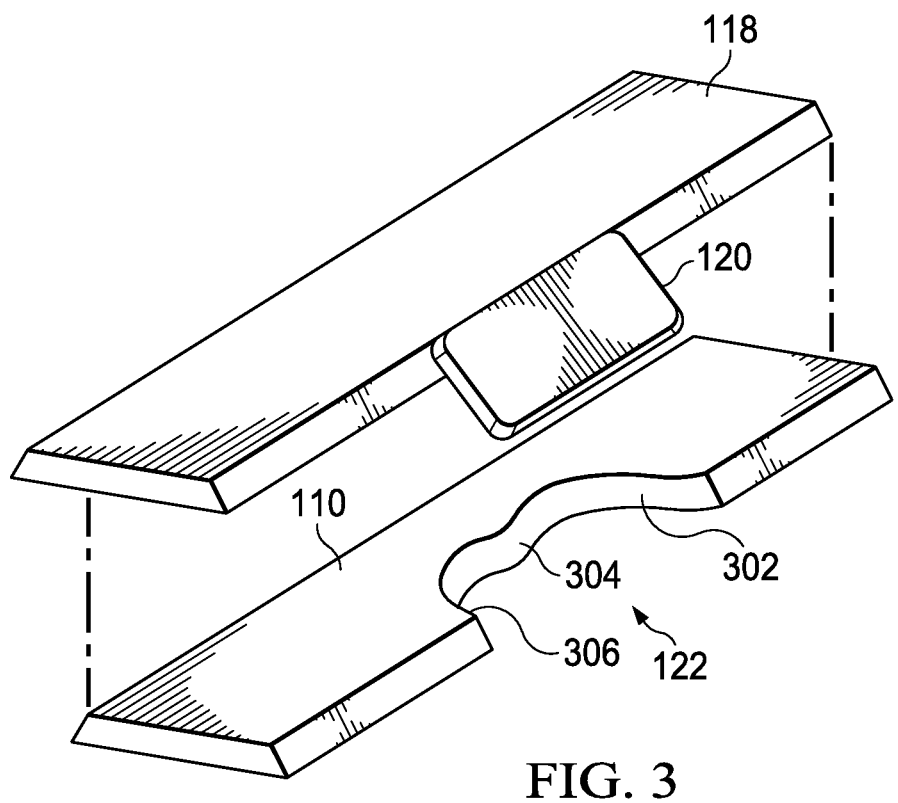
FIG. 3 shows a perspective view of clips that include engagement features for alignment in a stacked integrated circuit in accordance with various examples.
Figure 4:
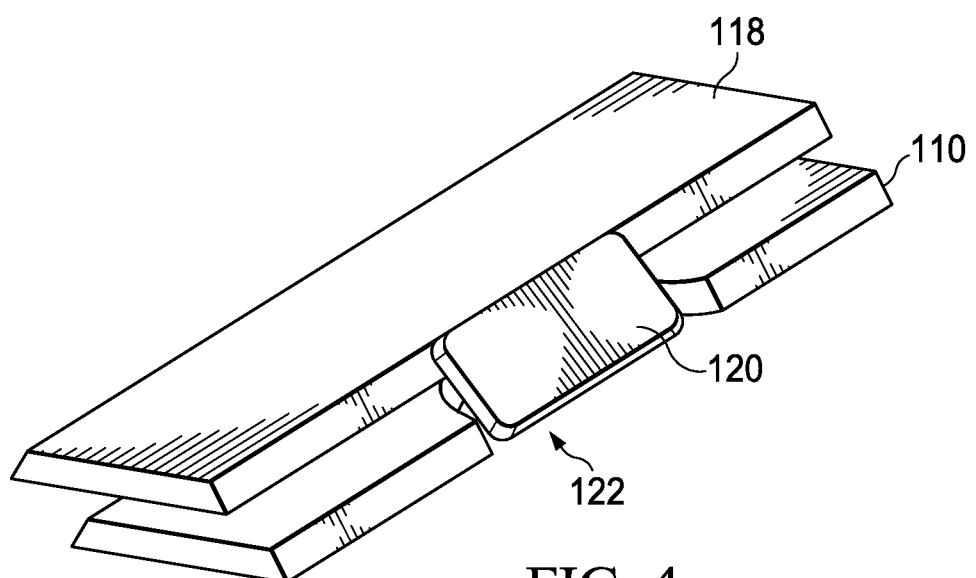
FIG. 4 shows a perspective view of clips used in in a stacked integrated circuit with engagement features interlocked to align the clips in accordance with various examples.

FIGS. 3 and 4 show perspective views of clips that include engagement features for alignment in a stacked integrated circuit in accordance with various examples. In FIG. 3, the electronic device 100 is being assembled. The second clip 118 is positioned and aligned with first clip 110 such that the protrusion 120 of the second clip 118 is aligned with the channel 122 of the first clip 110. In FIG. 4, the protrusion 120 of the second clip 118 engages the channel 122 of the first clip 110 (engages the walls 302, 304, and/or 306 of the first clip 110) to lock the second clip 118 into position relative to the first clip 110.

Figure 5:
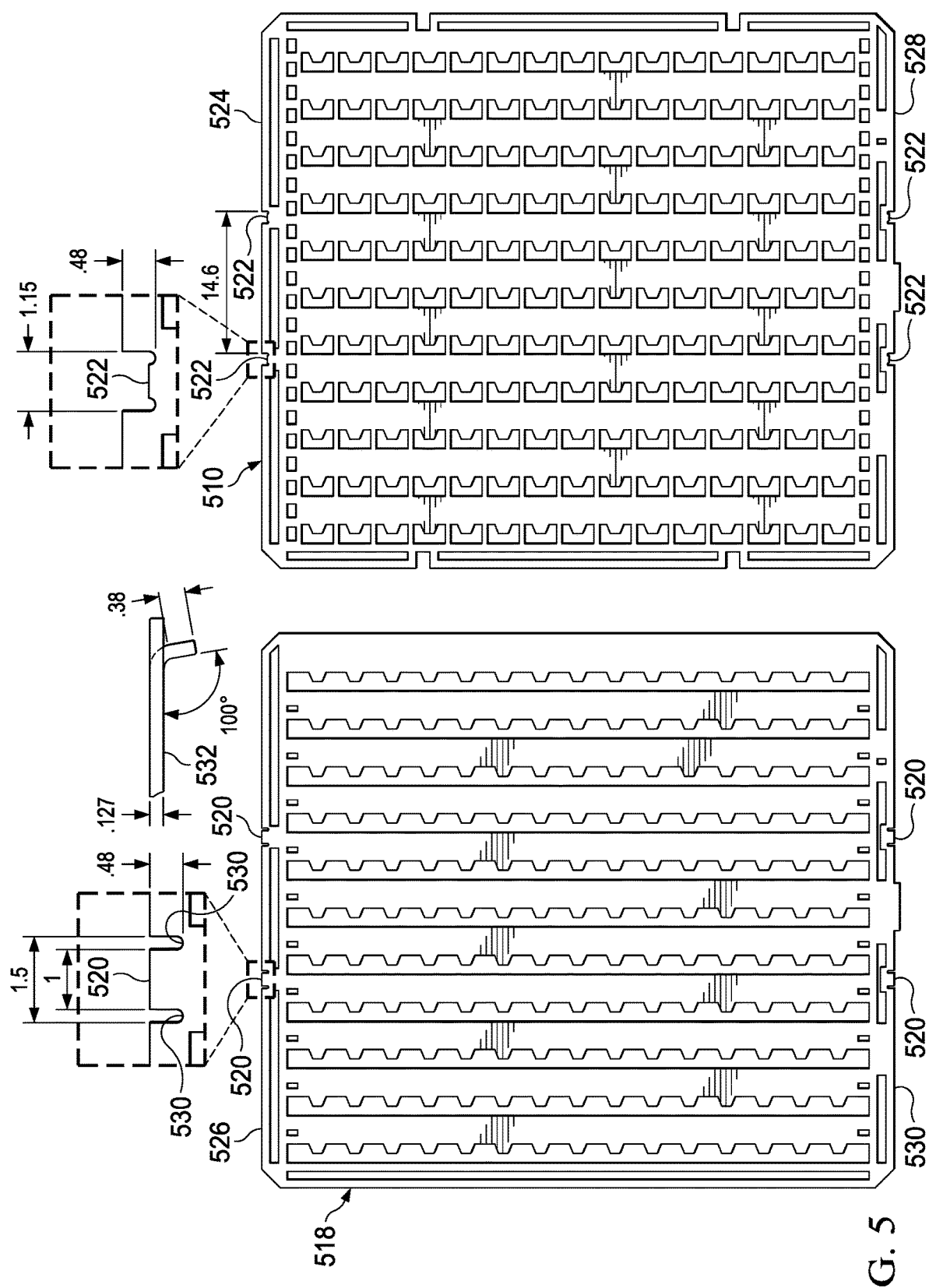
FIG. 5 shows a top view of a clip that includes engagement features for alignment in a stacked integrated circuit in accordance with various examples.

FIG. 5 shows a top view of a clip 510 and a clip 518 that includes engagement features for alignment in a stacked integrated circuit in accordance with various examples. The clip 510 is an embodiment of the first clip 110 and the clip 518 is an embodiment of the second clip 118. The clip 510 includes two channels 522 in side 524, and two channels 522 in side 528. The channels 522 are embodiments of the channel 120. The clip 518 includes two protrusions 520 in side 526, and two protrusions 520 in side 530. The protrusions 520 are embodiments of the protrusion 120.

In the implementation of FIG. 5, the two channels 522 are spaced about 14.6 millimeters (mm) apart on the side 524 of the clip 510. Some implementations of the clip 510 may space the channels 522 differently or include a different number of channels 522 on a side 510. The channel 522 is generally rectangular in shape having a width of about 1.15 mm and a depth of about 0.48 mm. The channel 522 may have different dimensions and/or shape in some implementations of the clip 510.

The protrusions 520 of the clip 518 are spaced about 14.6 mm apart on the side 526 and positioned in accordance with the positioning of the channels 522 of the clip 510. The protrusion 520 may be formed by removing material of the clip 518 to form two grooves 530 that bound the protrusion 520. The distance between the outer edges of the two grooves may be about 1.5 mm. The protrusion 520 is bent downward such that an angle of about 100 degrees is formed between the protrusion 520 and the surface 532 of the clip 518. The protrusion 520 is generally rectangular in shape having a width of about 1 mm and a length of about 0.48 mm. The length of the portion of the protrusion 520 extending beyond the surface 532 of the clip 518 may be about 0.38 mm in some implementations. The protrusion 520 may have different dimensions and/or shape in some implementations of the clip 518.

Figure 6:
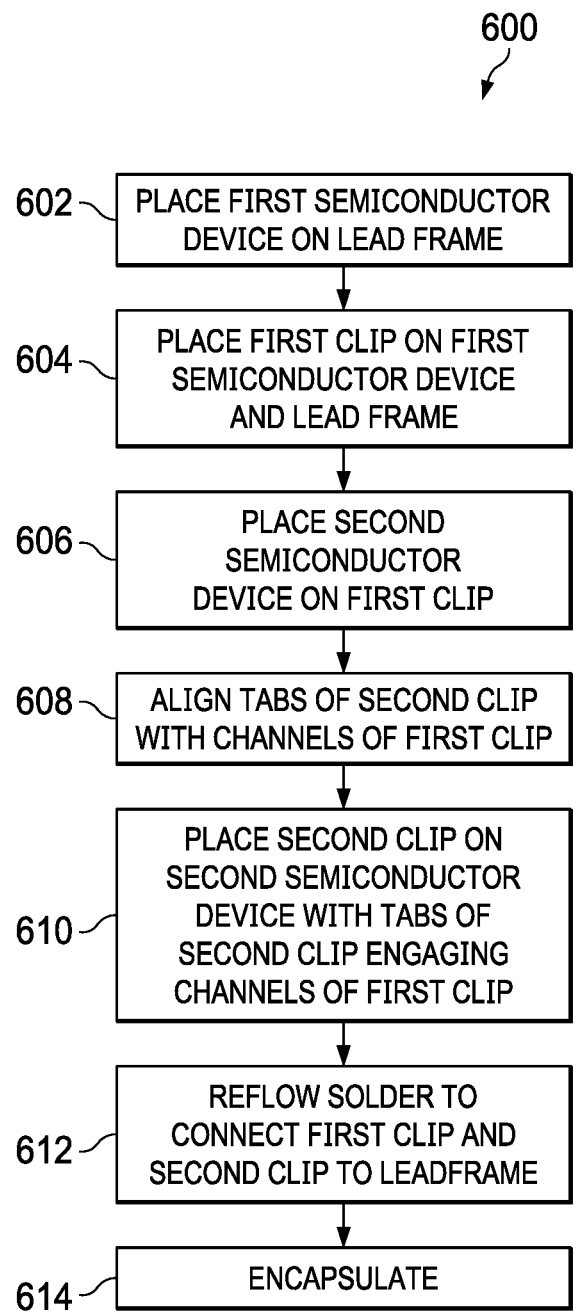
FIG. 6 shows a flow diagram for a method for packaging an electronic device in accordance with various examples.

FIG. 6 shows a flow diagram for a method 600 for packaging an electronic device in accordance with various examples. Though depicted sequentially as a matter of convenience, at least some of the actions shown can be performed in a different order and/or performed in parallel. Additionally, some implementations of the method 600 may perform only some of the actions shown.

In block 602, the first semiconductor device 104 is placed on the lead frame 102. Solder 106 is applied to the lead frame 102 before the first semiconductor device 104 is placed on the lead frame 102.

In block 604, the first clip 110 is disposed on the first semiconductor device 104. Solder 108 is applied to the first semiconductor device 104 before the first clip 110 is placed on the first semiconductor device 104. Disposing the first clip 110 on the first semiconductor device 104 includes aligning the first clip 110 with the first semiconductor device 104 and the lead frame 102 such that the first clip 110 conductively connects terminals on the first semiconductor device 104 to terminals on the lead frame 102.

In block 606, the second semiconductor device 114 is disposed on the first clip 110. Solder 112 is applied to the first clip 110 before the second semiconductor device 114 is placed on the first clip 110.

In block 608, the second clip 118 is positioned for placement on the second semiconductor device 114. Solder 116 is applied to the second semiconductor device 114, and the protrusion(s) 120 of the second clip 118 is aligned with the channel(s) 122 of the first clip 110.

In block 610, the second clip 118 is placed on the second semiconductor device 114, and the protrusion(s) 120 of the second clip 118 engages the channel(s) 122 of the first clip 110.

In block 612, the solder 116 is heated and reflows. The engagement of the protrusion(s) 120 of the second clip 118 with the channel(s) 122 of the first clip 110 prevents the second clip 118 from moving relative to the first clip 110 and the lead frame 102 as the solder is reflowed.

In block 614, the component stack, or a portion thereof, formed in blocks 602-612 is encapsulated (e.g., encased in plastic).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An electronic device, comprising:
    a lead frame;
    a first clip stacked on the lead frame;
    a second clip stacked on the first clip and the lead frame, wherein the second clip comprises a first protrusion that engages a first aperture of the first clip and secures the second clip to the first clip; and
    a plurality of semiconductor devices conductively coupled to the lead frame via the first clip and the second clip.

2. The electronic device of claim 1, further comprising a first semiconductor device disposed between the lead frame and the first clip.

3. The electronic device of claim 2, further comprising a second semiconductor device disposed between the first clip and the second clip.

4. The electronic device of claim 1, wherein the aperture has an opening with a length that is same as a length of a portion of the first protrusion.

5. The electronic device of claim 4, wherein the aperture is disposed in a first edge of the first clip and the first protrusion is formed at a first edge of the second clip.

6. The electronic device of claim 1, wherein the second clip comprises a second protrusion that secures the second clip to the first clip, wherein the second protrusion and the first protrusion are formed at opposite edges of the second clip.

7. The electronic device of claim 6, wherein the first protrusion and the second protrusion engage the first clip to prevent movement of the first clip relative to the second clip in at least two directions.

8. The electronic device of claim 7, wherein the first clip comprises a second aperture that engages the second protrusion.

9. The electronic device of claim 1, wherein the first protrusion is disposed at an oblique angle with respect to a surface of the second clip.

10. A circuit package comprising:
    a first clip comprising a first aperture formed in a first edge of the first clip;
    a second clip stacked with the first clip, the second clip comprising a first protrusion formed at a first edge of the second clip, wherein the first protrusion engages the first aperture of the first clip to secure the second clip to the first clip; and
    a lead frame stacked with the first clip and the second clip, wherein the first clip and the second clip are conductively coupled to the lead frame.

11. The circuit package of claim 10, wherein the second clip comprises a second protrusion formed at a second edge of the second clip.

12. The circuit package of claim 11, wherein the first clip comprises a second aperture formed in a second edge of the first clip, wherein the second protrusion of the second clip engages the second aperture of the first clip to secure the second clip to the first clip.

13. The circuit package of claim 11, wherein the first protrusion and the second protrusion prevent movement of the second clip relative to the first clip in at least two directions.

14. The circuit package of claim 10, wherein the first protrusion extends from the second clip at an oblique angle to a surface of the second clip.

15. A circuit package, comprising:
    a lead frame;
    a first conductive clip disposed on the lead frame, the first conductive clip comprising:
        a first edge, comprising:
            a first rectangular channel formed in the first edge; and
            a second rectangular channel formed in the first edge and spaced apart from the first rectangular channel;
        a second edge, comprising:
            a third rectangular channel formed in the second edge; and
            a fourth rectangular channel formed in the second edge and spaced apart from the third rectangular channel;
    a second conductive clip disposed on the first conductive clip, the second conductive clip comprising:
        a first edge, comprising:
            a first rectangular protrusion formed in the first edge and disposed in the first rectangular channel of the first conductive clip; and
            a second rectangular protrusion formed in the first edge, spaced apart from the first rectangular protrusion, and disposed in the second rectangular channel of the first conductive clip;
        a second edge, comprising:
            a third rectangular protrusion formed in the second edge and disposed in the third rectangular channel of the first conductive clip; and a fourth rectangular protrusion formed in the second edge, spaced apart from the third rectangular protrusion, and disposed in the fourth rectangular channel of the first conductive clip.

16. The circuit package of claim 15, wherein the first rectangular channel is spaced apart from the second rectangular channel by a distance of approximately 14.6 millimeters.

17. The circuit package of claim 15, wherein:
the first rectangular protrusion and the second rectangular protrusion are approximately 1 millimeter in width and 0.48 millimeters in length; and
the first rectangular channel and the second rectangular channel are approximately 1.15 millimeters in width and 0.48 millimeters in depth.

18. The circuit package of claim 15 wherein the second conductive clip comprises:
a first surface; and
a second surface opposite the first surface;
wherein the first rectangular protrusion and the second rectangular protrusion are disposed at approximately a 100 degree angle with respect to the first surface and the second surface.

19. The circuit package of claim 15, wherein the second surface is nearer the first conductive clip than the first surface, and a portion of the first rectangular protrusion extending beyond the second surface at the approximately 100 degree angle is approximately 3.8 millimeters in length.

* * * * *